United States Patent
Le Perchec et al.

(10) Patent No.: US 9,893,229 B2
(45) Date of Patent: Feb. 13, 2018

(54) METHOD FOR MANUFACTURING A PHOTOVOLTAIC CELL WITH SELECTIVE DOPING

(71) Applicant: COMMISSARIAT A L'ENERGIE ATOMIQUE ET AUX ENERGIES ALTERNATIVES, Paris (FR)

(72) Inventors: Jérôme Le Perchec, Grenoble (FR); Rémi Monna, Muespach Le Haut (FR)

(73) Assignee: COMMISSARIAT À L'ÉNERGIE ATOMIQUIE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/124,097

(22) PCT Filed: Mar. 5, 2015

(86) PCT No.: PCT/FR2015/050540
§ 371 (c)(1),
(2) Date: Sep. 7, 2016

(87) PCT Pub. No.: WO2015/132532
PCT Pub. Date: Sep. 11, 2015

(65) Prior Publication Data
US 2017/0018677 A1 Jan. 19, 2017

(30) Foreign Application Priority Data
Mar. 7, 2014 (FR) ...................................... 14 51869

(51) Int. Cl.
*H01L 31/18* (2006.01)
*H01L 31/0224* (2006.01)
(Continued)

(52) U.S. Cl.
CPC .... *H01L 31/1864* (2013.01); *H01L 31/02168* (2013.01); *H01L 31/022425* (2013.01);
(Continued)

(58) Field of Classification Search
CPC ........... H01L 31/1864; H01L 31/02167; H01L 31/068; H01L 31/0682; H01L 31/02168; H01L 31/022425; H01L 31/022441
See application file for complete search history.

(56) References Cited

U.S. PATENT DOCUMENTS 9,236,505 B2 * 1/2016 Kim .................. H01L 31/02242
9,312,420 B2 * 4/2016 Jin ...................... H01L 31/1804
(Continued)

OTHER PUBLICATIONS

International Search Report as issued in International Patent Application No. PCT/FR2015/050540, dated Jun. 9, 2015.
(Continued)

*Primary Examiner* — Jose R Diaz
(74) *Attorney, Agent, or Firm* — Pillsbury Winthrop Shaw Pittman LLP

(57) ABSTRACT

A method for creating a photovoltaic cell, includes forming a first doped region in a semiconductor substrate having a first concentration of doping elements; forming, by ion implantation, alignment units, the largest size of which is smaller than one millimeter, and a second doped region, adjacent to the first region with a second concentration of doping elements; heat-treating the substrate to activate the doping elements and to form an oxide layer at the surface of the substrate, the second concentration and the heat treatment conditions being selected such that the oxide layer has a thickness above the alignment units that is larger, by at least 10 nm, than the thickness of the oxide layer above an area of the substrate adjacent to the alignment units; depositing an antireflection layer onto the oxide layer; and depositing an electrode onto the antireflection coating, through a screen, opposite the second region.

13 Claims, 5 Drawing Sheets

(51) Int. Cl.
    *H01L 31/068*     (2012.01)
    *H01L 31/0216*     (2014.01)

(52) U.S. Cl.
    CPC .... *H01L 31/022441* (2013.01); *H01L 31/068* (2013.01); *H01L 31/0682* (2013.01); *Y02E 10/547* (2013.01); *Y02P 70/521* (2015.11)

(56) References Cited

U.S. PATENT DOCUMENTS

| | | | |
|---|---|---|---|
| 2011/0244626 A1* | 10/2011 | Huang | H01L 21/223 |
| | | | 438/98 |
| 2016/0126374 A1* | 5/2016 | Kim | H01L 31/02021 |
| | | | 136/256 |
| 2016/0260852 A1* | 9/2016 | Tamura | H01L 31/02243 |

OTHER PUBLICATIONS

Dubé, C. E., et al., "High efficiency selective emitter cells using patterned ion implantation," Science Direct, Energy Procedia 8 (2011), pp. 706-711.

Written Opinion of the International Searching Authority as issued in International Patent Application No. PCT/FR2015/050540 dated Aug. 12, 2016.

\* cited by examiner

METHOD FOR MANUFACTURING A PHOTOVOLTAIC CELL WITH SELECTIVE DOPING

CROSS-REFERENCE TO RELATED APPLICATIONS

This is the U.S. National Stage of PCT/FR2015/050540, filed Mar. 5, 2015, which in turn claims priority to French Patent Application No. 1451869, filed Mar. 7, 2014, the entire contents of all applications are incorporated herein by reference in their entireties.

TECHNICAL FIELD

The present invention relates to method for manufacturing a photovoltaic cell which presents selective doping at the surface, such as a selective emitter cell or an interdigitated back contact cell.

STATE OF THE ART

A photovoltaic cell is a device made from a semiconductor material such as silicon, which absorbs energy from photons and converts it into electrical energy. Schematically this device comprises a first silicon area doped with p-type impurities (for example boron atoms), in contact with a second silicon area doped with n-type impurities (for example phosphorous atoms), thus forming a p-n junction. The p-n junction creates an electric field which dissociates the electron-hole pairs generated by the absorption of photons, with the electrons being directed to the n-area and the holes to the p-area.

A p-n junction may be created simply by the formation of an n-type doped area within a p-type substrate. Electrical contacts are further formed at the surface of the substrate on either side of the p-n junction, that is, on the n-doped area and on the p-doped area, in order to collect electrons and holes. These contacts are generally made using screen-printing, which is a printing technique that is quick and simple to carry out.

In order to improve the quality of the contacts, one technique consists of heavily doping the semiconductor region located beneath the contacts. A high dopant concentration, however, increases losses through Auger recombination, in particular at the surface, and therefore reduces the efficiency of the photovoltaic cell. For this reason this heavy doping is only performed locally (i.e. beneath the contacts). A face of the cell equipped with contacts may therefore show a variable concentration of dopants.

A first example of surface adapted doping is provided by selective emitter cells.

FIG. 1A is a schematic top view of a selective emitter photovoltaic cell 10 and FIG. 1B is a section view of this cell along axis A-A of FIG. 1A.

The selective emitter cell 10 comprises a substrate 12 of p-type doped silicon. The substrate 12 comprises a front face 12a exposed to solar radiation and a rear face 12b, on the opposite side to the front face 12a (FIG. 1B). Thus the photons enter the cell through the front face 12a of the substrate.

In this configuration of photovoltaic cells, the p-n junction is achieved though the formation of a layer of n-type doped silicon 14 at the front face 12a of the p-type substrate. The layer 14 is, for example, formed by gaseous diffusion of phosphorous (e.g. $POCl_3$ diffusion) or by the implantation of ionised phosphorous atoms in the substrate. Over-doped regions 14', which have dopant concentration greater than that of the layer 14, are further created in the layer 14, for example by ion implantation or by application of a laser beam. The n-doped layer 14 and the over-doped regions 14', also n-type, are called "emitters", as opposed to the p-type substrate which forms a "base" of the p-n junction.

At the front face 12a of the substrate the highly doped areas 14' are connected to a first electrode 16a, for example in the form of metal lines (FIG. 1A), with which they make good ohmic contact due to their low resistivity. The lighter doping of the layer 14 reduces electron-hole pair recombination and results in less screening of high energy incident photons. A second electrode 16b provides contact on the rear face 12b of the substrate.

Finally anti-reflection layer 18 (not shown in FIG. 1A) made of SiN is arranged on the front face 12a of the substrate to guarantee good absorption of the photons in the photovoltaic cell.

Thus, the selective emitter cell 10 presents, on its front face, two regions with the same conductivity type (here n-doping) which have different dopant concentrations in order to achieve distinct electrical and photovoltaic characteristics.

Cells with interdigitated back contacts (so-called "IBCs") provide a second example of photovoltaic cells having a selective doping structure. In this other cell configuration, the p-n junction is formed on the rear face of an n-type substrate (non-illuminated face). This rear face comprises two interlaced doped areas which have opposite types of doping: one p area and an n+ area for an n-type substrate (where the n+ area has a repulsive field effect which favours a lower degree of carrier recombination at the surface). Thus, in contrast to a selective emitter cell, an IBC cell presents, on its rear face, two doped areas which have opposite types of doping.

FIG. 2A is a simplified top view (rear face 12b) of an IBC interdigitated back contacts cell 20 and FIG. 2B is a section view of this cell along axis B-B of FIG. 2A.

The IBC cell 20 comprises, on its rear face 12b of the n-type silicon substrate, n+ type doped areas 22, that is n-type areas which are more highly doped than the substrate 12 ("base"), and p-type doped ("emitter") areas 24. Areas 22 and 24 have a lower resistivity than the substrate and advantageously act as supports for the electrical contacts. Thus "n" electrodes 26a and "p" electrodes 26b are arranged respectively in contact with the doped areas 22 and 24. Electrodes 26a and 26b, in the form of interlaced combs, cover almost all of the rear face of the substrate (FIG. 2A). Finally an anti-reflection layer 18 made of SiN is arranged on the front face 12a of the substrate (FIG. 2B).

The formation of the areas 22 and 24 requires, for example, two ion implantation steps, each being undertaken though a specific mask in order to define the pattern of the implanted area (here a comb).

For the formation of photovoltaic cells, doping by ion implantation is often preferred to doping by diffusion or laser doping techniques since it enables better quality emitters to be obtained. This technique further provides better control of dopant profiles in the emitters.

The article ["High efficiency selective emitter cells using patterned ion implantation", C. E. Dubé et al., Energy Procedia 8, pp. 706-711, 2011] describes a method for creating a selective emitter cell by ion implantation, from a substrate made of p-type doped crystalline silicon. This method comprises the following steps:

a first ion implantation step for doping the front face of the substrate in its entirety;

a second ion implantation step through a mask to define over-doped regions
an oxidation annealing to form a passivation layer;
the deposition of an anti-reflection coating on the passivation layer; and finally
a screen-printing step to form metallisation tracks on over-doped regions.

The over-doped regions on the front face of the substrate are difficult to distinguish optically, which makes the deposition of metallisation tracks on these risky. To overcome this, the author of this article proposes positioning the implantation mask and the printing screen in relation to the substrate, taking an edge of this substrate as a reference. Thus, the metallisation tracks and the over-doped regions are aligned. Nevertheless, such an alignment reference lacks precision and the over-doped regions must be sufficiently wide (about 500 μm) for the electrode tracks to be deposited on top in an accurate manner.

Document US2011/0139230 discloses another method for manufacturing selective emitter cells by ion implantation, wherein the printing screen is positioned relative to the substrate using alignment patterns made by laser in the substrate beforehand. These alignment patterns improve precision, but their formation using lasers requires an additional step and additional equipment in the method. Such a manufacturing method is therefore difficult to use on a large scale and at reduced cost.

SUMMARY OF THE INVENTION

There is therefore a need to manufacture, in a simple and economic manner, a photovoltaic cell equipped with an electrode that is aligned with precision on a highly doped semiconductor region.

According to the invention, this need tends to be met by providing the following steps:
providing a semiconductor substrate doped of a first conductivity type;
forming a first doped region in the substrate, the first doped region having a first concentration of doping elements;
forming, by ion implantation of doping elements into the substrate, at least one set of alignment patterns, whose the largest dimension is less than a millimeter, and a second region neighbouring the first region, having a second concentration of doping elements greater than the first concentration;
subjecting the substrate to a heat treatment, so as to activate the doping elements and form an oxide layer at the substrate surface, above the alignment patterns, the first region and the second region, the second concentration and the heat treatment conditions being chosen such that the oxide layer has a thickness above the alignment patterns which is at least 10 nm greater than the thickness of the oxide layer above a substrate area adjacent to the alignment patterns;
depositing an anti-reflection layer on the oxide layer; and
depositing through a screen an electrode onto the anti-reflection layer, facing the second region, the screen being positioned relative to the substrate using the alignment patterns.

In one preferred embodiment, the first region is formed by ion implantation of a first dose of doping elements across an entire face of the substrate.

The alignment patterns and the second region can then by formed by ion implantation of a second dose of doping elements through said face of the substrate on which a mask is superimposed, whereby the alignment patterns and the second region accumulate the first and second doses.

The first and second doses are advantageously between $5 \times 10^{14}$ cm$^{-2}$ and $2.5 \times 10^{15}$ cm$^{-2}$ and are implanted using an implantation energy between 5 keV and 15 keV.

In a first embodiment example, the photovoltaic cell is a selective emitter photovoltaic cell; said face of the substrate is a front face of the photovoltaic cell; the first region is doped of a second conductivity type opposite to the first type, so as to form a p-n junction; and the alignment patterns and the second region are doped of the second conductivity type.

Preferably, the heat treatment comprises a single annealing phase in a dry atmosphere comprising oxygen at a temperature between 800° C. and 900° C. for a period of less than 30 min, or in a humid atmosphere comprising oxygen at a temperature between 700° C. and 800° C. for a period of less than 1 hour. In a second embodiment example, the photovoltaic cell is an interdigitated back contacts photovoltaic cell; said face of the substrate is a rear face of the photovoltaic cell; the first region is doped of the first conductivity type; and the alignment patterns and the second region are doped of a second conductivity type opposite to the first type, so as to form a p-n junction.

Preferably, the heat treatment comprises a first annealing phase without oxygen at a temperature between 950° C. and 1100° C. for a period of less than 30 min and a second annealing phase, either in a dry atmosphere comprising oxygen at a temperature between 800° C. and 900° C. for a period of less than 30 minutes, or in a humid atmosphere comprising oxygen at a temperature between 700° C. and 800° C. for a period of less than 45 minutes.

The method according to the invention may also exhibit one or more of the following characteristics, taken individually or according to all technically possible combinations:
The first concentration and the heat treatment conditions are chosen such that the oxide layer has a thickness above the first region of at least 5 nm;
a third region having the same conductivity type as the first region is formed in the substrate on the opposite side to the first region and at the same time as the first region;
the electrode is deposited by screen-printing and comprises a plurality of metallisation tracks distributed over the anti-reflection layer;
the mask comprises a first set of openings corresponding to the second region, a second set of openings corresponding to the alignment patterns and a third set of openings corresponding to additional patterns, said additional patterns being covered with metal studs during the screen-printing stage and acting as alignment marks during an additional screen-printing step.

BRIEF DESCRIPTION OF THE DRAWINGS

Other characteristics and advantages of the invention will become clear from the description which is given thereof below, by way of indication and in no way limiting, with reference to the appended figures, among which.

For greater clarity, identical or similar elements are marked by identical reference signs in all of the figures.

DETAILED DESCRIPTION OF AT LEAST ONE EMBODIMENT

In the following description, a region of a semiconductor substrate that has a concentration of doping elements greater than the concentration of doping elements in neighbouring regions, for all dopant species taken together, is called "over-doped".

Figure 1A:
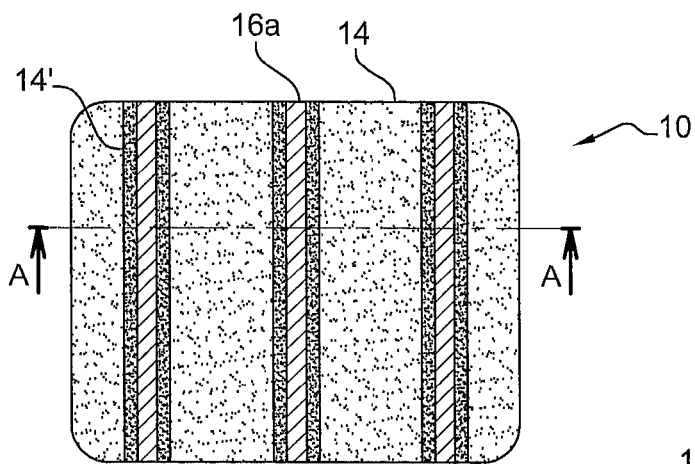
FIGS. 1A and 1B represent, in top view and in section view along A-A respectively, a selective emitter cell according to the prior art.
Figure 1B:
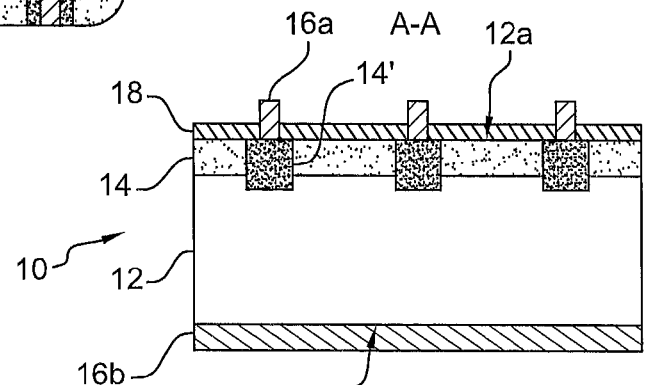
Figure 2A:
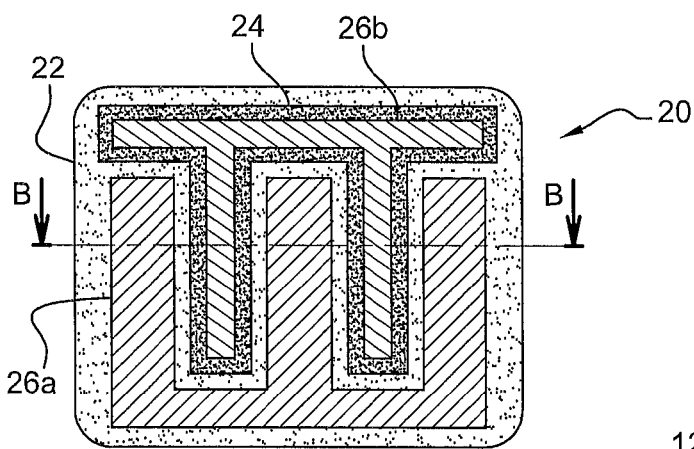
FIGS. 2A to 2B represent, in top view and in section view along B-B respectively, an interdigitated back contacts cell according to the prior art.
Figure 2B:
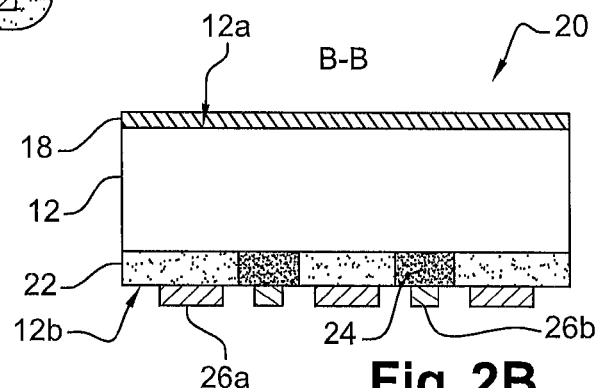

In the case of a selective emitter cell such as that in FIGS. 1A and 1B, it may in particular involve a region (ref. 14') doped of a conductivity type and having a concentration of doping elements greater than that of the adjacent region (14) doped of the same conductivity type. This may also be a region doped of a first conductivity type, having a concentration of doping elements greater than that of the adjacent region doped of a second, opposite, conductivity type, as in the case of a cell with interdigitated back contacts (FIGS. 2A-B).

The first and second types of opposite conductivities naturally refer to n-type doping and p-type doping, or conversely. N-doping consists in introducing into a semiconductor material doping elements (also called dopant impurities) which are electron donors, such as atoms of phosphorous, of arsenic or of antimony for a silicon substrate, and p-doping consists in introducing electron acceptor doping elements, such as atoms of boron or of gallium (for a silicon substrate).

In its final state, a photovoltaic cell with selective doping comprises at least one over-doped region on which an electrode is arranged. This highly doped region allows good ohmic contact with the electrode to be achieved, and thus improves the electrical performance of the cell.

The electrode comprises, preferably, a plurality of metallic tracks distributed over one or more over-doped regions. "Metallisation" is the term commonly used for the step consisting in making metal tracks on the semiconductor substrate of a photovoltaic cell. The electrode may be deposited through a screen, whose openings correspond to the different metallic tracks, by any appropriate deposition technique and in particular by screen-printing.

In order to facilitate this metallisation step, it is envisaged to form alignment marks on the face of the substrate intended to receive the electrode, which will serve as references for positioning the printing screen. Unlike the methods of the prior art, the alignment marks are here formed by ion implantation at the same time as the formation of the over-doped region. Thanks to a high contrast in reflectivity, these alignment patterns are easily detectable for precise positioning of the screen in relation to the substrate.

FIGS. 3A to 3E represent steps F1 to F5 of a manufacturing method for a photovoltaic cell with selective doping, which uses these alignment patterns formed by ion implantation.

In this first embodiment, the cell is a selective emitter photovoltaic cell. It is obtained from a substrate 12 made of a semiconductor material doped of a first conductivity type, for example a p-type doped crystalline silicon.

Figure 3A:
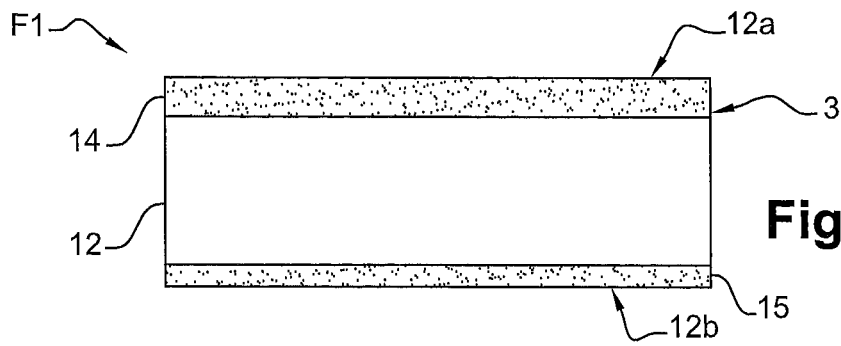
FIGS. 3A to 3E represent the steps of a method for manufacturing a photovoltaic cell with selective doping according to the invention.

During a first step F1 shown in FIG. 3A, a region 14 of the substrate 12 is doped of a second conductivity type, opposite to that of the substrate, that is, of n-type. A p-n junction 30 is thus formed, at the interface of the n-doped region 14 (called the emitter) and of the remaining part of the p-doped substrate 12 (called the base). The emitter 14 is here formed on the front face 12a of the substrate, that is, on the face intended to receive solar radiation when the photovoltaic cell has been finished.

As shown in FIG. 3A, the region 14 advantageously occupies the entire front face 12a of the substrate. An advantage of doping the entire front face of the substrate 12a is that it simplifies not only the step F1, but also the later steps in the manufacturing method, in particular the delimitation of the over-doped regions (step F2).

The doping of the region 14 may be achieved by various techniques, in particular gaseous diffusion or the application of a laser at the substrate surface. In one preferential embodiment, however, this doping is achieved by the implantation of ionised atoms through the front face 12a of the substrate. The ion implantation, for example by ion beam or by immersion in a plasma, results in emitters of better electronic quality and in improved control of dopant profile, in comparison with doping by diffusion. This also does away with the need for the steps for removing the phosphorous glass, normally carried out after $POCl_3$ type phosphorous diffusion.

The dopants are preferably implanted using implantation energies between 5 keV and 15 keV, whether using ion beam implantation or plasma immersion (for example).

The n-type dopant impurities introduced into the silicon are for example phosphorous atoms. Furthermore, a shadow mask may be placed above the substrate during the ion implantation when uniform doping of the front face 12a is not desired.

The dose D1 of atoms implanted at step F1 is advantageously between $5 \times 10^{14}$ cm$^{-2}$ and $2.5 \times 10^{15}$ cm$^{-2}$. A region 14 is thus obtained, which offers little obstruction to the absorption of photons and for which the charge carrier recombination rate is low.

A region 15 may also be n-type doped at the rear face 12b of the substrate (that is on the opposite side to the region 14) during the formation of the doped region 14, in particular during $POCl_3$ gas diffusion. This region 15 has no effect on the functioning of the cell once metallisation of the rear face has been carried out.

Prior to step F1, the substrate 12 may have undergone steps for preparation of its surface, in particular a step for cleaning its front face 12a and its rear face 12b, followed by a step for structuring its front face 12, for example in the form of pyramids. The purpose of this structuring is to increase, through diffraction, the proportion of photons which enter the substrate. Since these preparation steps are conventional, they are not described in detail here.

Figure 3B:
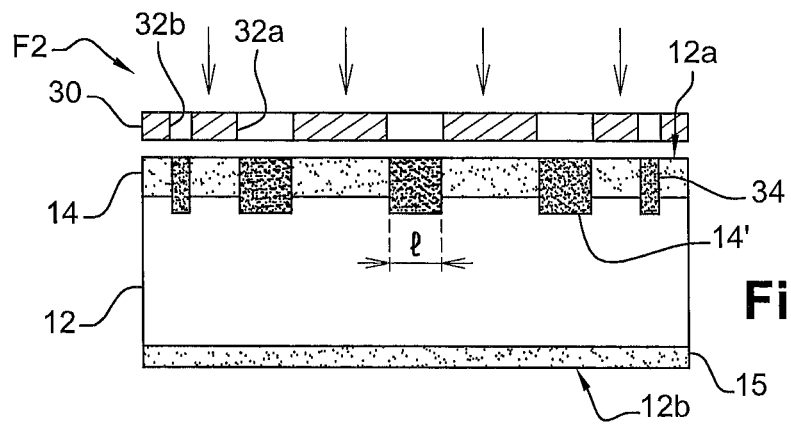

At step F2 of FIG. 3B a new doping step by ion implantation is carried out through a shadow mask 30. At least one over-doped region 14', adjacent to region 14, and two alignment patterns 34 are defined during this step in the front face 12a of the substrate. The over-doped region 14' and the alignment patterns 34 have a dopant concentration C2 which is greater than the dopant concentration C1 in region 14.

By way of an example, three over-doped regions 14' and two alignment marks 34 on either side of the regions 14' are shown in FIG. 3B. All are surrounded by the more lightly-doped region 14.

In this first embodiment example, the ions implanted during step F2 belong to the same conductivity type as that in the region 14 (n-type). The regions 14' thus form a so-called selective emitter, intended to be covered by the metallisation tracks.

When the front face 12a has been entirely doped in step F1 (FIG. 3A), the dose D2 of ions implanted in step F2 may be equal to, less than or greater than the implantation dose D1 of step F1. The over-doped regions 14' and the alignment patterns 34 are then formed within the layer 14 and exhibit a concentration of dopants which corresponds to the sum of doses D1 and D2. There are in this case no strong constraints on the placement of the shadow mask 30 in relation to the substrate 12.

An implantation dose D2 equal to the implantation dose D1 simplifies the method and improves its reproducibility. A same piece of implantation equipment, configured using the same parameters, is used for steps F1 and F2.

Conversely, when the highly doped regions 14' are implanted outside the lightly doped region 14, that is, in areas of the initial p-type doped substrate 12, the implantation dose D2 is then greater than the dose D1, such that a greater concentration of dopants is obtained. Two different (i.e. complementary) shadow masks 30 are then provided for implantation steps F1 and F2.

The steps F1 and F2 may be carried out in any order, given that the concentration of dopants C2 of region 14' results either from the addition of dopants from step F1 and of dopants from step F2, or from a single implantation step F2 carried out independently of step F1.

The shadow mask 30 is preferably located at a distance between 0 and 5 mm from the substrate 12 and positioned parallel to the latter. It comprises a first set of openings 32a whose shapes and dimensions correspond to those of the regions 14' and a second set of openings 32b which correspond to the alignment patterns 34. These openings are made, for example, by laser drilling.

Preferably the over-doped regions 14' form lines at the surface of the substrate whose transverse dimension (the width t in the sectional plane of FIG. 3B) is between 250 μm and 300 μm for selective emitter silicon cells.

The mask 30 is a removable shadow mask, and may be formed from various materials, in particular from silicon, graphite or from metal, possible covered with a non-metallic protective skin, for example of resin or of an amorphous dielectric material. It may also be a "stencil" mask like those used in screen-printing equipment.

Figure 5A:
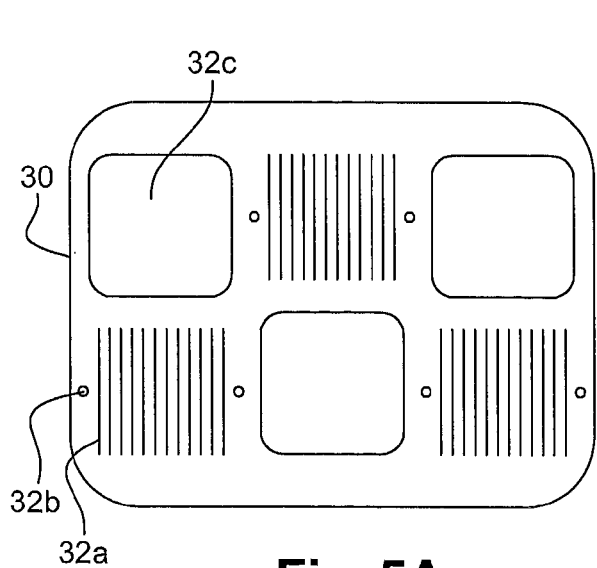
FIG. 5A represents an example of an implantation mask used in the steps of FIGS. 3A and 3B.

FIG. 5A shows an example of a "composite" shadow mask 30 which can serve both for the ion implantation of step F1 and the ion implantation of step F2. This shadow mask comprises two series of identical patterns, in order to process several substrates simultaneously. The first series patterns each comprise a single opening 32c intended for the implantation of dopants over the entire surface of the substrate ("full plate") during step F1 (dose D1). The second series patterns correspond to openings 32a and 32b of FIG. 3B, to form over-doped regions and alignment patterns respectively, during implantation step F2 (dose D2).

This mask is advantageously used for the manufacture of a batch which includes several photovoltaic cells, in view of large scale industrial production. A first group of cells is implanted using the first series of patterns, whilst a second group of patterns is implanted with the second series of patterns. The patterns are then offset by one notch, horizontally or vertically, and then the second implantation is carried out with the other series of patterns for each group, without the need to withdraw the substrates from the implantation chamber between two ion implantation stages.

Figure 3C:
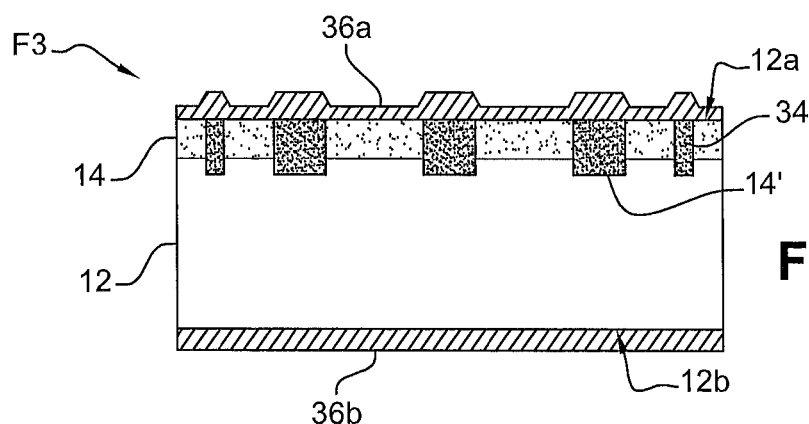

FIG. 3C represents a heat treatment step F3, on the one hand used to electrically activate the dopants in regions 14, 14' and in the patterns 34, and on the other hand to oxidise the surface of the substrate 12. An oxide layer 36a then covers the front face 12a comprising the n-doped region 14, n-over-doped regions 14' and the alignment patterns 34. Preferably a layer of oxide 36b also covers the rear face 12b of the substrate. Since the semiconductor here is silicon, the layers 36a and 36b are made of silicon oxide, for example of $SiO_2$. Preferably the thickness of the layers 36a and 36b is greater than 5 nm and less than 40 nm.

The heat treatment advantageously comprises a first phase for activating dopants at a temperature T1 and a second phase under a partial oxygen flow at a temperature T2 allowing the formation of oxide layers 36a and 36b. By thus dissociating the two heat treatment actions, different annealing conditions can be chosen for these two actions and each of them optimised. The annealing temperatures (T1, T2) and/or the annealing periods may in particular be different. By way of an example, the activation temperature T1 of the dopants is between 800° C. and 1100° C. and the oxidation temperature T2 is between 700° C. and 900° C.

Alternatively, the heat treatment of step F3 can comprise a single annealing phase, under an atmosphere comprising oxygen, which both carries out oxidation of the dopants and growth of the oxide layers 36a and 36b.

The thickness of the silicon oxide layer formed on the front face 12a of the substrate naturally depends on the oxidising annealing conditions: principally the annealing period, the temperature and the oxygen flow. The dopant concentration of the oxidised material also influences the oxide thickness. Thus under identical annealing conditions, the higher the dopant concentration (all species combined) the thicker the oxide. It will in addition be noted that for a given dose and a given energy, the plasma immersion technique allows the dopants to be implanted nearer to the surface, in comparison with ion beam implantation, which allows a thicker oxide to be grown.

Since the front face 12a shows different dopant concentrations C1 and C2, the oxide layer 12a is of variable thickness. The latter is thicker above the alignment patterns 34 and the over-doped regions 14', as is shown in FIG. 3C.

Figure 4:
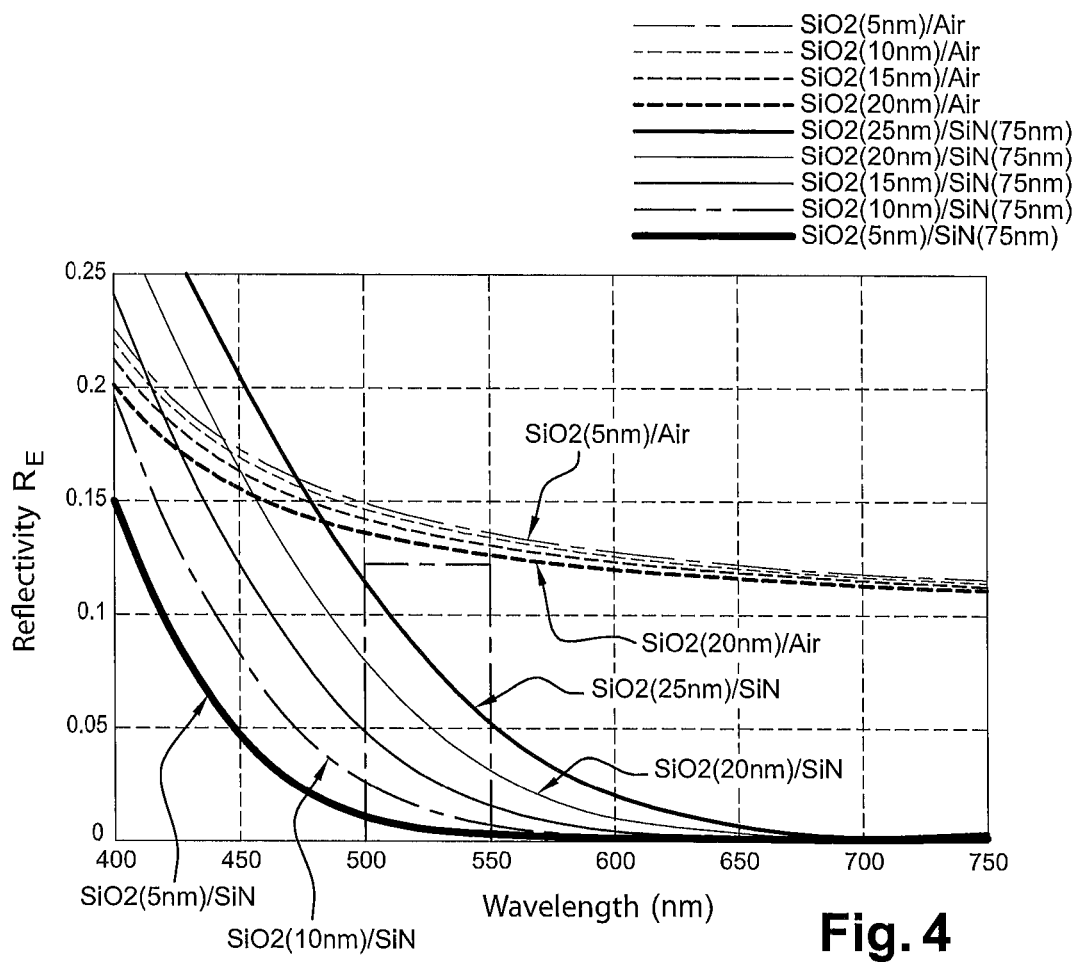
FIG. 4 represents the reflectivity in the visible spectrum of an SiO2 oxide layer, taken alone or in combination with an anti-reflection layer made of SiN, for different thicknesses of the oxide layer.

The first series of broken line curves in FIG. 4 shows the reflectivity $R_E$ in the visible range (400-750 nm) of a silicon substrate whose surface presents conventional pyramidal texturing and which is covered with a single layer of silicon oxide $SiO_2$, for thicknesses of the layer ranging from 5 nm to 20 nm (in steps of 5 nm).

It will be observed that the thicker the oxide $SiO_2$, then the lower is the reflectivity $R_E$, in other words, the less the substrate reflects the incident light. This observation is furthermore true irrespective of the wavelength of the incident light. Consequently, a contrast in reflectivity arises from the difference in thickness between the oxide layer 36a on the alignment patterns 34 and the regions 14' on the one hand and the oxide 36a on the layer 14 on the other hand.

This contrast is defined by the following relationship:

$$C = \frac{R_{E1} - R_{E2}}{R_{E1} + R_{E2}}$$

wherein $R_{E1}$ represents the reflectivity of the alignment patterns 34 and $R_{E2}$ represents the reflectivity of the adjacent doped region 14.

The broken line curves in FIG. 4 are close together. This means that the reflectivity contrast due to a single oxide layer of variable thickness is very small, less than about 5%. It is for this reason that it is difficult to distinguish highly doped regions amongst more lightly doped regions with the naked eye.

Figure 3D:
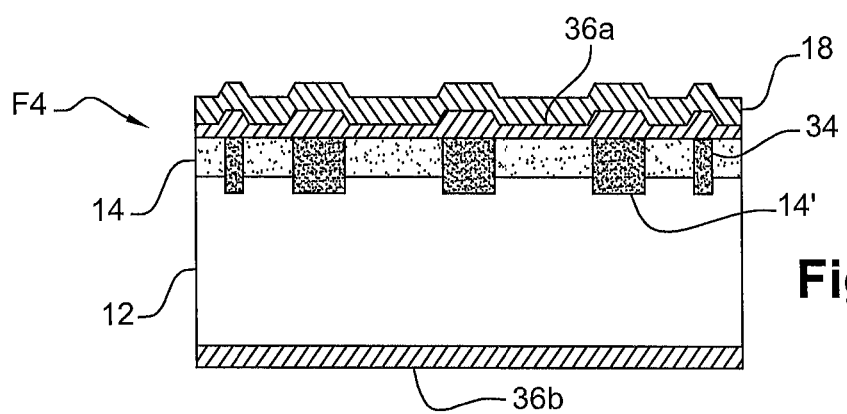

In order to increase the optical contrast between the regions of the substrate which correspond to the alignment patterns 34 and the immediately adjacent region 14, an anti-reflection layer 18, for example made of SiN, is deposited on the oxide layer 36a during step F4 (FIG. 3D). This anti-reflection layer 18 is widely used in photovoltaic cells, since it allows the number of photons absorbed by the cells to be increased (it reduces the reflectivity of the emitter 14). However, in addition to carrying out this role in the selective emitter cell 30, the inventors have noted that this anti-reflection layer also had the effect of accentuating the reflectivity difference $R_{E1}$-$R_{E2}$ caused by a variable oxide thickness.

In FIG. 4, a second series of curves in solid line shows the reflectivities for different oxide layer thicknesses (from 5 to 25 nm, in steps of 5 nm), each now being covered with a 75 nm thick anti-reflection layer made of SiN. It can be observed on the one hand that the separation between two curves is much greater when a SiN anti-reflection layer is placed on top of the SiO$_2$ oxide layer. Consequently the visual contrast C is amplified thanks to the anti-reflection layer 18. On the other hand, the change in the reflectivity $R_E$ with the thickness of the SiO$_2$ oxide layer in the presence of the SiN layer is reversed in comparison with the previous situation (i.e. without the SiN layer): the thicker the SiO$_2$ oxyde, the greater the reflectivity $R_E$, or in other words the more the substrate reflects the incident light.

For example purpose, in the wavelength range 500-550 nm which corresponds to the colour green, the reflectivity contrast C is equal to approximately 48% between a 5 nm thick SiO$_2$ layer and a 10 nm thick layer, both layers being covered with a 75 nm thick anti-reflection layer of SiN. The contrast C is equal to 70% for oxide layers of 5 nm and 15 nm thickness, and equal to 37% between 10 nm and 15 nm thickness and equal to 58% between 10 nm and 20 nm.

By carrying out different calculations of the optical contrast C, it may be shown that a difference of at least 10 nm thickness between two layers of SiO$_2$ allows a particularly high reflectivity contrast to be achieved (in the presence of the anti-reflection layer), greater than 50%. As has been described above, the thickness of the oxide layer depends not only on the oxidation annealing conditions, but also on the concentration of the dopants. The oxidation annealing conditions in step F3 and the concentration of dopants C2 implanted in alignment patterns 34 at step F2 are to be chosen so as to obtain a thickness difference of at least 10 nm between the portion of oxide 36a located above the alignment patterns 34 and the portion located outside these patterns, for example above the lightly doped region 14 (FIG. 3C). The alignment patterns 34 may thus be easily detected at the surface of the substrate, without recourse to complex imaging systems, for example of the infrared type.

The choice of dopant concentrations C2 in the selective emitter 14' and the alignment patterns 34 is therefore motivated by the need to obtain in these regions (in addition to a low resistivity for establishing good ohmic contact) an oxide layer that is 10 nm thicker at least relative to the region surrounding the alignment patterns (the n-doped region 14 or the p-doped substrate 12 when the patterns are implanted outside the layer 14).

Preferably the heat treatment comprises a single annealing phase which carries out the activation of the dopants and the thermal oxidation. The conditions for such annealing to obtain the oxide layer 36a are as follows:
    the annealing is undertaken in the presence of dry oxygen (mixture of oxygen and nitrogen in the gas phase) and its duration is less than 30 min;
    the annealing temperature is between 800° C. and 900° C., for example 850° C.;
    the flow of oxygen during the oxidation phase is between 10 and 50 liters per minute, with the oxygen/nitrogen ratio ranging from 0.2 to 1.

Alternatively, the heat treatment is carried out in a single annealing step in a moist atmosphere (i.e. one that comprises water vapour) between 700° C. and 800° C. for a period of less than 1 hour.

The implantation dose D2 during step F2 is advantageously between $5^E14$ and $2.5^E15$ atoms/cm$^2$, and preferably between $1^E15$ and $2.5^E15$ atoms/cm$^2$. It is estimated that the concentration of atoms C2 which results from this is between $1^E20$ and $1^E22$ atoms/cm$^3$, at the surface of the areas 14'/34 (over a depth of about 25 nm).

The choice of concentrations of dopants C1 in the lightly doped region 14 is, for its part, constrained by the need to limit Auger-type recombination in the photovoltaic cell, since this region forms the greater part of the emitter.

When the doping F1 is carried out by gaseous diffusion, the concentration C1 at the surface (i.e. over the first 25 nm) is preferably between $5^E19$ and $1^E21$ atoms/cm$^3$ (it varies according to the position on the wafer, the diffusion parameters and according to the type of dopant). When step F1 is carried out by ion implantation the implanted dose D1 is advantageously between $5^E14$ and $2.5^E15$ atoms/cm$^2$, and preferably between $1^E15$ and $2.5^E15$ atoms/cm$^2$.

In more general terms, a ratio C2/C1 of concentrations at the surface (i.e. in the first 25 nm) which is greater than or equal to 1.5 could be considered to produce the oxide thickness difference of 10 nm (at least) required to distinguish the alignment patterns 34.

In determining the concentration C1 and/or heat treatment parameters, the fact that the oxide layer 36a above the region 14 should preferably have a thickness of at least 5 nm may be taken into account. This minimum oxide thickness guarantees that the surface of the substrate in this region is sufficiently passivated. Indeed, in addition to the fact that the oxide layer 36a reveals the alignment patterns, it also acts as a passivation layer for the substrate surface 12. Under the annealing conditions and for the ranges of doses/concentration C1 indicated above, the oxide layer 36a possesses a thickness above the lightly doped region 14 which is greater than 5 nm.

The anti-reflection layer 18 is formed of a material which has a refractive index greater than that of the oxide (greater than 1.5 in the case of SiO$_2$), for example SiN, SiON, TiO$_2$ or Al$_2$O$_3$. Its thickness is optimised such that the regions 14 (regions not covered by the metal) absorb the maximum number of photons. This thickness is preferably between 50 nm and 100 nm. Alternatively, the anti-reflection 38 can be formed from a composite layer with an average index greater than that of the oxide, that is, a stack of several layers whose total height does not exceed 150 nm, for example SiN/SiON (where the SiON is towards the exterior of the cell).

Once the anti-reflection layer 18 has been deposited (FIG. 3D), the alignment patterns 34 appear clearly on the surface of the substrate. Step F5 may then be carried out, for the formation of the electrodes, on the front face and rear face of the substrate.

Figure 3E:
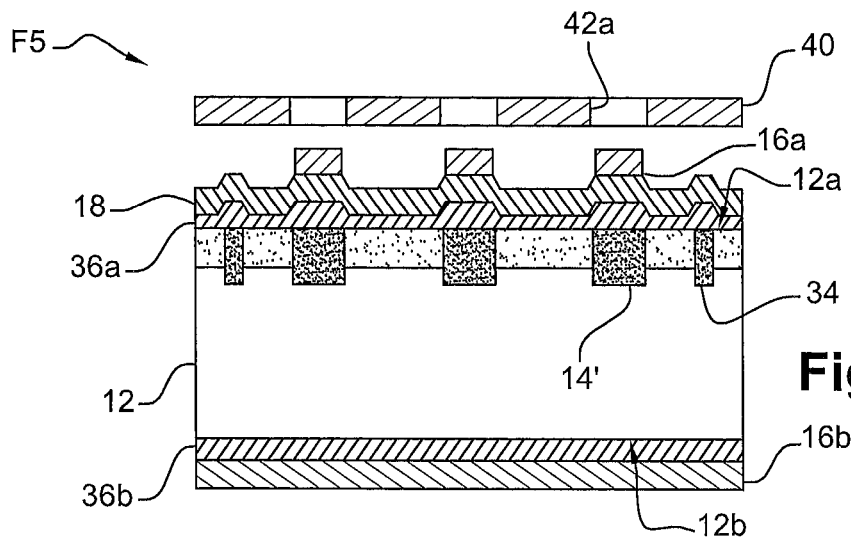

In one preferred embodiment shown in FIG. 3E, this step F5 is carried out by screen-printing, according to the stencil technique. Metallisation tracks 16a are deposited on the anti-reflection layer 18, facing the over-doped regions 14' (i.e. selective emitter), using a screen-printing screen 40. This screen comprises openings 42a which correspond to the electrode pattern to be formed, for example, long straight lines which are parallel to each other.

The screen 40 is positioned above the substrate 12 so that the openings 42a are facing the regions 14' of the substrate. This positioning of the screen 40 is achieved using the alignment patterns 34, which are made visible using the oxide layer 36a and the anti-reflection layer 18. The positioning may in addition also be automated, thanks to a visual identification of the alignment patterns, using a camera (the screen is positioned automatically after the camera has referenced the marks 34). Screen-printing equipment is generally equipped with such a camera in the visible range.

A screen-printing paste is spread over the anti-reflection layer 18 through the screen 40 placed on the substrate, forming the metallisation tracks 16a of FIG. 3E. The screen-printing paste is a mixture preferably comprising metallic micro-particles, for example of silver or of aluminium, glass frit, an organic binding agent and a solvent. Then in a later step in the manufacturing method (not shown) the substrate is subjected to infrared annealing. During this step, the screen-printing paste migrates through the fine layers of oxide 36a and of anti-reflection 18 and comes into contact with the over-doped regions 14'.

Metallisation 16b s also carried out on the rear face 12b of the substrate. For example, a second screen-printing paste is deposited full-plate on the previously formed oxide layer 36b. As with the metallisation tracks 16a, the metallisation 16b perfuses through the oxide layer. After infrared annealing, it forms the metallic electrode in ohmic contact with the p-type substrate 12.

In the case of selective emitter cells, the metallisation tracks 16a (and therefore the corresponding openings 42a) preferably have a width of less than 100 µm. The metallic tracks 16a are even finer than the over-doped lines 14' in order to overcome alignment errors—with the lines 14' being for example 250 µm wide. Furthermore, the largest of the dimensions of the alignment patterns (and therefore of the corresponding openings 42b) is less than 1 mm, and advantageously less than the width of the over-doped regions 14' (<250-300 µm.). Such fine alignment patterns 34 guarantee precise positioning of the screen 40 in relation to the substrate 12. Thus the metallisation tracks 16a partially covering the over-doped areas 14' can be accurately deposited. The metallisation tracks 16a do not extend outside the over-doped areas 14', and are, to the contrary, centred above the latter.

The alignment patterns 34 are preferably located in a surface area of the substrate which starts half-way from the centre of the wafer (in the case of a circular substrate) and which stops a little before the outer edge of the wafer. This location of the patterns 34 makes for more precise alignment of the printing screen 40. Thus, the creation of patterns 34 is avoided on the extreme edge of the wafer, where the implantation doses and oxide layer thicknesses are less well controlled.

The formation of the upper electrode, i.e. on the emitter side, may include two successive screen-printing steps (screen-printing known by the name of "double print" and "dual print"). For example, the aim of a first step is to form metallisation tracks 16a on over-doped regions 14' and the aim of a second step to form transverse connection tracks, which electrically join the tracks 16a.

Figure 5B:
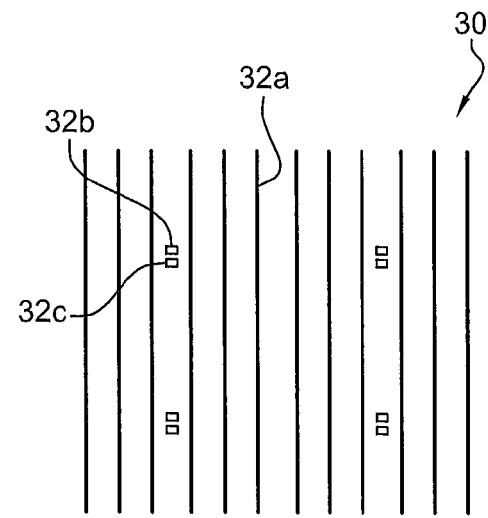
FIG. 5B represents another example of an implantation mask used in the step of FIG. 3B.

FIG. 5B shows an example of an implantation mask 30 in the case of "double" screen-printing. The mask 30 used may comprise in addition to the openings 32a (corresponding to the over-doped regions) and 32b (alignment marks for aligning the first metallisation step with a screen 40), a set of additional openings 32c to form additional patterns. These additional patterns are intended to receive metallic studs which in turn act as alignment marks during the second metallisation step. To this end, the screen 40 therefore contains additional openings which correspond to these metallic studs. The metallic studs are not in contact with the core of the substrate since the implanted regions 14' are deep and thus they do not act as an unwanted recombination centre for photo-carriers.

The manufacturing method described above in relation to a selective emitter cell is also suited to the formation of a cell with interdigitated back contacts. The method is implemented on the rear face of the substrate, rather than on the front face, and is used to form one or more over-doped layers of conductivity type opposite to that of a neighbouring lightly-doped region.

Figure 6:
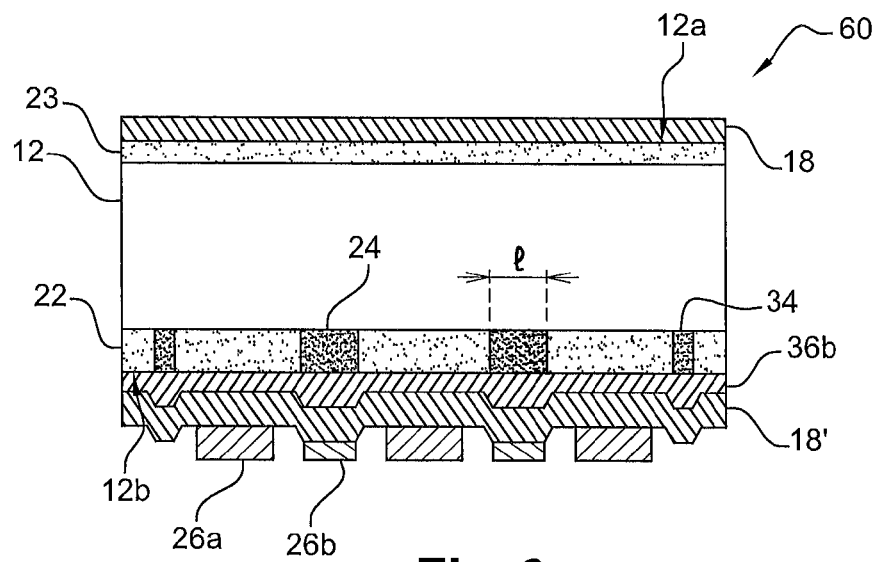
FIG. 6 represents an interdigitated back contacts cell obtained thanks to the manufacturing method according to the invention.

FIG. 6 represents a photovoltaic cell 60 of the IBC ("Interdigitated back contacts") type obtained in a second embodiment example of the manufacturing method.

This example considers a substrate made of n-type doped silicon 12, for example doped with phosphorous. A region 22 of the rear face 12b is first of all n+-type doped, i.e. more highly than the n-type substrate forming the base of the cell (enhanced doping with phosphorous for example). Preferably the region 22 occupies the rear face 12b in its entirety, and forms an n+ doped layer at the surface of the substrate 12.

Preferably, an n+ type doped region 23 is also present on the front face 12a of the substrate 12. In general less highly doped than the region 22 (but more than the substrate 12), the region 23 creates a repulsive field which favours weaker recombination of carriers at the surface of the substrate, in the same way as layer 22. The lateral flanks of the substrate can also be n+ doped for the same reason.

The n+ doping of the regions 22 and 23 can also be achieved, for example, by $POCl_3$ diffusion (followed by a removal of the phosphorous glass) over the entire circumference of the substrate (including the flanks), or by implantation of ionised atoms of phosphorous or of compound ions of the phosphorous-hydrogen type ($PH+$, $PH^2+$ etc.) on each face of the substrate (step F1).

At least one over-doped region 24 and alignment patterns 34, all p-type doped (doping opposite to that of the substrate 12, for example using ionised boron atoms or compound ions of the boron-hydrogen or boron-fluorine type) are then formed by ion implantation, using a shadow mask (step F2).

The p-n junction is then formed and the over-doped region 24 forms the emitter of the IBC cell 60. The p-type over-doped region 24 may be adjacent to the n-type region 22, as illustrated in FIG. 6, that is, adjoining region 22 or separated from region 22 by a small distance. Indeed, a portion of the substrate left intact between the two regions allows certain electrical performances of the photovoltaic cell to be improved. The separation between the doped region 22 and the over-doped region 24 is for example between 200 nm and 300 nm, where the regions 22 and 24 can be 0.5 mm to 1.5 mm wide.

The region 24 is preferably formed in the n-type doped layer 22. An over-doped region may therefore be, in the case of an IBC cell, a region of a first conductivity type formed within a region of a second, opposite, conductivity type, such that the first type "counter-balances" the second type. This over-doped region therefore accumulates the dopants of the first type and dopants of the second type.

In the example of the IBC cell shown in section view in FIG. 6, two over-doped regions 24 are formed in the layer 22. Preferably, the width l of the emitter (regions 24) is between 500 μm and 2 mm.

The heat treatment of the step F3 allows the n-type dopants of region 22 and p-type dopants of the region 24 to be activated. At least one part of this heat treatment is carried out under oxygen in order to form an oxide layer 36b of variable thickness on the rear face 12b, with a difference of at least 10 nm between the oxide portion covering the patterns 34 and the oxide portion covering the lightly doped region 22.

The activation annealing temperature is preferably between 950° C. and 1100° C. in order to fully activate the boron atoms. By way of an example, the heat treatment comprises a first plateau around 1050° C. over a period t1 less than 30 minutes without oxygen, in order to activate the dopants, and a second thermal plateau, either between 800° C. and 900° C. for a period t2 less than 30 min under a flow of dry oxygen, or between 700° C. and 800° C. (for example 720° C.) for a period t2 less than 45 min under a stream of oxygen and of water vapour (since wet oxidation is faster than dry oxidation it is carried out at a lower temperature) to form the layer 36b.

The concentration ranges of dopants C1/C2 (or ion implantation D1/D2 doses) applicable to an IBC cell are substantially the same as those described for a selective emitter cell.

The oxide layer 36b is then covered with an anti-reflection layer 18' to discriminate the two types of doped regions 22, 24 and the alignment patterns (step F4). The anti-reflection layer 18' is preferably formed from the same material as the layer 18 covering the front face 12a exposed to solar radiation, for example made of SiN.

Finally the electrodes 26a and 26b are deposited on the SiN layer 18', facing, respectively, doped regions 22(n) and 24(p) (step F5). These electrodes are preferably deposited by screen-printing through a screen aligned with the substrate by means of the patterns 34.

By proceeding in this way, only a single mask is used (i.e. a single implantation step) in order to delimit both the n regions and the p regions of an IBC cell at the same time. This greatly simplifies the manufacturing method for these cells in comparison with conventional process comprising two successive implantation steps each being carried out with a different mask.

Figure 7A:
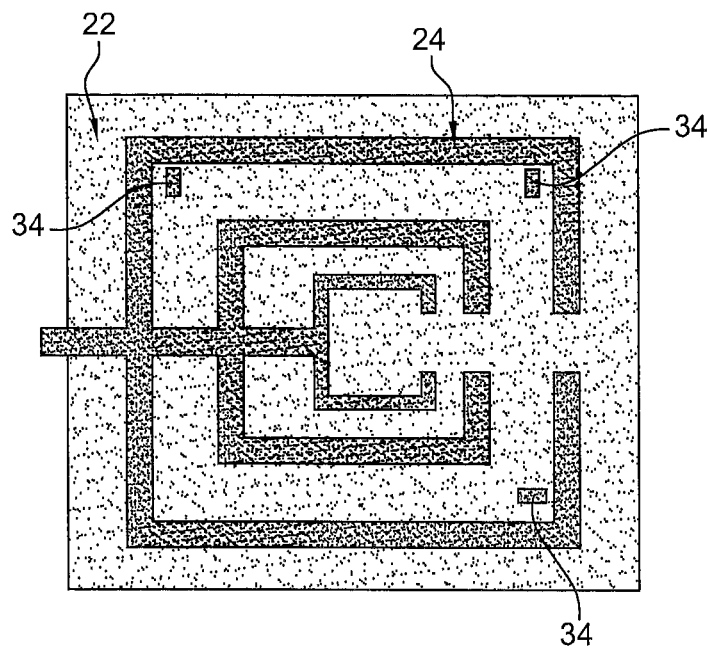
FIG. 7A represents an example of implantation patterns in the rear face of the interdigitated back contacts cell of FIG. 6, after the step of FIG. 3B.
Figure 7B:
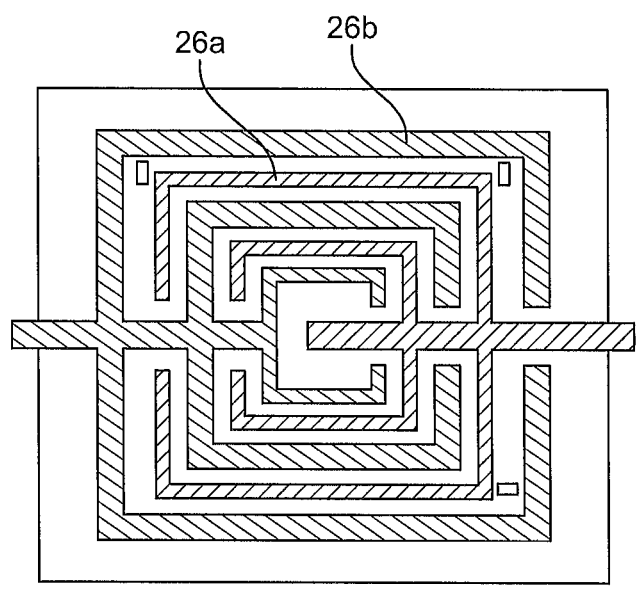
FIG. 7B represents an example of electrode patterns in the rear face of the interdigitated back contacts cell of FIG. 6, after the step of FIG. 3E.

The FIGS. 7A and 7B show another example of an IBC cell in bottom view (rear face), before and after, respectively, the deposition of electrodes 26a-26b on doped regions 22-24. The metallic tracks of each electrode 26a, 26b have an overall rectangular shape (like the circumference of the cell) and are inter-connected. Furthermore, the electrode tracks 26a are interdigitated with those of the electrode 26b, such that the electrodes are interleaved with each other. Three discrete alignment marks 34 are distributed over the surface of the cell and are formed at the same time as the over-doped region 24.

The method for formation of an IBC cell may comprise an optional cleaning step between implantation F2 and heat treatment F3, in order to remove any surface contaminants and/or surface defects associated with implantation. This step is, for example, carried out using a standard cleaning process of the "SC1" or "SC2" type.

Numerous variants and modifications of the manufacturing method described above will become apparent to those skilled in the art. In particular, semiconductor materials other than silicon may act as a base for the manufacture of these photovoltaic cells. Substrates made of germanium (whose oxide is GeO or $GeO_2$) or of silicon-germanium alloy may be used in particular. The doping types may naturally be reversed, considering for example an n-type substrate rather than a p-type substrate in the case of a selective emitter cell (p-type substrate rather than an n-type substrate in the case of the IBC cell).

Finally, the manufacturing method according to the invention is not limited to specific chemical species of dopants, with the boron and phosphorous cited above being given by way of examples. Two dopants of a given type may be used, together or independently of each other. For example purpose, phosphorous and arsenic may be chosen to dope two distinct regions of a same conductivity type (e.g. phosphorous in region 14' and arsenic in region 14). The implanted dopant ions may be compound ions formed from known precursor gases such as $PH_3$, $AsH_3$, $BF_3$ and $B_2H_6$, for example hydrogenated phosphorous ions ($PH^+$, $PH^{2+}$ . . . ) or fluorinated boron ions ($BF^{2+}$).

The invention claimed is:
1. A method for manufacturing a photovoltaic cell comprising:
   providing a semiconductor substrate doped of a first conductivity type;
   forming a first doped region in the substrate, the first region having a first concentration of doping elements;
   forming, by ion implantation of doping elements into the substrate, at least one set of alignment patterns, whose the largest dimension is less than a millimeter, and a second region neighbouring the first region, having a second concentration of doping elements greater than the first concentration;
   subjecting the substrate to a heat treatment, so as to activate the doping elements and to form an oxide layer at a surface of the substrate, above the alignment patterns, the first region and the second region, the second concentration and the heat treatment conditions being chosen such that the oxide layer has a thickness above the alignment patterns which is at least 10 nm greater than the thickness of the oxide layer above a substrate area adjacent to the alignment patterns;
   depositing an anti-reflection layer on the oxide layer; and
   depositing through a screen an electrode on the anti-reflection layer, facing the second region, the screen being positioned relative to the substrate using the alignment patterns.

2. The method according to claim 1, wherein the first concentration and the heat treatment conditions are chosen such that the oxide layer has a thickness above the first region of at least 5 nm.

3. The method according to claim 1, wherein the first region is formed by ion implantation of a first dose of doping elements across an entire face of the substrate.

4. The method according to claim 3, wherein the first dose is between $5 \times 10^{14}$ cm$^{-2}$ and $2.5 \times 10^{15}$ cm$^2$, and is implanted using an implantation energy between 5 keV and 15 keV.

5. The method according to claim 3, wherein the alignment patterns and the second region are formed by ion implantation of a second dose of doping elements through said face of the substrate on which a mask is superimposed, whereby the alignment patterns and the second region accumulate the first and second doses.

6. The method according to claim 5, wherein the second dose is between $5 \times 10^{14}$ cm$^{-2}$ and $2.5 \times 10^{15}$ cm$^2$, and is implanted using an implantation energy between 5 keV and 15 keV.

7. The method according to claim 5, wherein:
the photovoltaic cell is a selective emitter photovoltaic cell;
said face of the substrate is a front face of the photovoltaic cell;
the first region is doped of a second conductivity type opposite to the first type, so as to form a p-n junction; and
the alignment patterns and the second region are doped of the second conductivity type.

8. The method according to claim 7, wherein the heat treatment comprises a single annealing phase in a dry atmosphere containing oxygen, at a temperature between 800° C. and 900° C. for a period of less than 30 min, or in a humid atmosphere containing oxygen at a temperature between 700° C. and 800° C. for a period of less than 1 hour.

9. The method according to claim 5, wherein
the photovoltaic cell is an interdigitated back contacts photovoltaic cell;
said face of the substrate is a rear face of the photovoltaic cell;
the first region is doped of the first conductivity type; and
the alignment patterns and the second region are doped of a second conductivity type opposite to the first type, so as to form a p-n junction.

10. The method according to claim 9, wherein the heat treatment comprises a first annealing phase without oxygen at a temperature between 950° C. and 1100° C. for a period of less than 30 min and a second annealing phase, either in a dry atmosphere containing oxygen at a temperature between 800° C. and 900° C. for a period of less than 30 minutes, or in a humid atmosphere containing oxygen at a temperature between 700° C. and 800° C. for a period of less than 45 minutes.

11. The method according to claim 1, wherein a third region having the same conductivity type as the first region is formed in the substrate on the opposite side to the first region and at the same time as the first region.

12. The method according to claim 1, wherein the electrode is deposited by screen-printing and comprises a plurality of metallisation tracks distributed over the anti-reflection layer.

13. The method according to claim 12, wherein the alignment patterns and the second region are formed by ion implantation of a second dose of doping elements through a face of the substrate on which a mask is superimposed, wherein the mask comprises a first set of openings corresponding to the second region, a second set of openings corresponding to the alignment patterns and a third set of openings corresponding to additional patterns, said additional patterns being covered with metal studs during the screen-printing step and acting as alignment marks during an additional screen-printing step.

* * * * *

UNITED STATES PATENT AND TRADEMARK OFFICE
CERTIFICATE OF CORRECTION

PATENT NO. : 9,893,229 B2
APPLICATION NO. : 15/124097
DATED : February 13, 2018
INVENTOR(S) : Jérôme Le Perchec et al.

It is certified that error appears in the above-identified patent and that said Letters Patent is hereby corrected as shown below:

On the Title Page

Item (73) Assignee:
Please correct the Assignee name as follows:
COMMISSARIAT À L'ÉNERGIE ATOMIQUE ET AUX ÉNERGIES ALTERNATIVES, Paris (FR)

Item (56) References Cited: U.S. PATENT DOCUMENTS:
All U.S. references cited were omitted. They are:
2011/0139230  06/2011     ROHATGI et al.
2012/0273040  11/2012     KIM et al.
2009/0308439  12/2009     ADIBI et al.
2012/0152338  06/2012     HA et al.
2012/0214270  08/2012     STOCKUM et al.

Signed and Sealed this
Sixteenth Day of October, 2018

Andrei Iancu
*Director of the United States Patent and Trademark Office*